(12) United States Patent
Roper

(10) Patent No.: US 11,476,555 B1
(45) Date of Patent: Oct. 18, 2022

(54) ELECTROCHEMICALLY TUNABLE, SOLID-STATE METAMATERIAL-BASED DEVICES

(71) Applicant: HRL Laboratories, LLC, Malibu, CA (US)

(72) Inventor: Christopher S. Roper, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 732 days.

(21) Appl. No.: 16/524,021

(22) Filed: Jul. 27, 2019

Related U.S. Application Data

(60) Provisional application No. 62/778,995, filed on Dec. 13, 2018.

(51) Int. Cl.

| | |
|---|---|
| *H01P 7/08* | (2006.01) |
| *H01Q 1/36* | (2006.01) |
| *G02F 1/17* | (2019.01) |
| *G02F 1/19* | (2019.01) |
| *H01Q 15/00* | (2006.01) |
| *H01L 45/00* | (2006.01) |

(52) U.S. Cl.
CPC .................. *H01P 7/08* (2013.01); *G02F 1/17* (2013.01); *G02F 1/19* (2013.01); *H01P 7/086* (2013.01); *H01P 7/088* (2013.01); *H01Q 1/364* (2013.01); *H01Q 15/0086* (2013.01); *H01L 45/085* (2013.01); *H01L 45/1266* (2013.01); *H01L 45/146* (2013.01)

(58) Field of Classification Search
CPC .. H01P 7/08; H01P 7/082; H01P 7/084; H01P 7/088; H01P 7/086; H01L 45/085; H01L 45/1266; H01L 45/146; G02F 1/17; G02F 1/19; H01Q 1/364; H01Q 15/0086
See application file for complete search history.

(56) References Cited

U.S. PATENT DOCUMENTS 9,837,177 B1 * 12/2017 Roper .................... G21K 1/006

OTHER PUBLICATIONS

Badloe et al., "Metasurfaces-Based Absorption and Reflection Control: Perfect Absorbers and Reflectors" Journal of Nanomaterials vol. 2017, Article ID 2361042 (Nov. 6, 2017).

(Continued)

*Primary Examiner* — Stephen E. Jones
(74) *Attorney, Agent, or Firm* — O'Connor & Company; Ryan P. O'Connor

(57) ABSTRACT

Disclosed are electrochemically tunable metamaterials which are capable of complete reversibility such that the metamaterial itself can physically disappear (out of the active region) and reappear later, in a controllable manner. Some variations provide an electrochemically tunable, solid-state metamaterial-based device comprising a plurality of metamaterial unit cells, wherein each of the metamaterial unit cells comprises: an ion conductor containing mobile metal ions; a first electrode in contact with the ion conductor, wherein the first electrode is contained in a metasurface negative space disposed on the ion conductor; a second electrode in contact with the ion conductor, wherein the second electrode is electrically isolated from the first electrode; and a metal-containing region containing one or more metals, wherein the metal-containing region is contained within a metasurface positive space disposed on the ion conductor.

34 Claims, 7 Drawing Sheets

(56) References Cited

OTHER PUBLICATIONS

Baena et al., "Equivalent-Circuit Models for Split-Ring Resonators and Complementary Split-Ring Resonators Coupled to Planar Transmission Lines" IEEE Transactions on Microwave Theory and Techniques, vol. 53, No. 4 (Apr. 1, 2015).

Morea et al., "Electrically Tunable, CMOS-Compatible Metamaterial Based on Semiconductor Nanopillars" ACS Photonics 2018, 5,4702-4709 (Oct. 23, 2018).

Thyagarajan et al., "Millivolt Modulation of Plasmonic Metasurface Optical Response via Ionic Conductance" Adv. Mater. 2017, 29, 1701044 (Jun. 14, 2017).

Xu et al., "Electrically tunable terahertz metamaterials with embedded large-area transparent thin-film transistor arrays" Scientific Reports | 6:23486 | DOI: 10.1038/srep23486 (Mar. 22, 2016).

Zheludev et al., "From metamaterials to metadevices" Nature Materials vol. 11 (Nov. 1, 2012).

\* cited by examiner

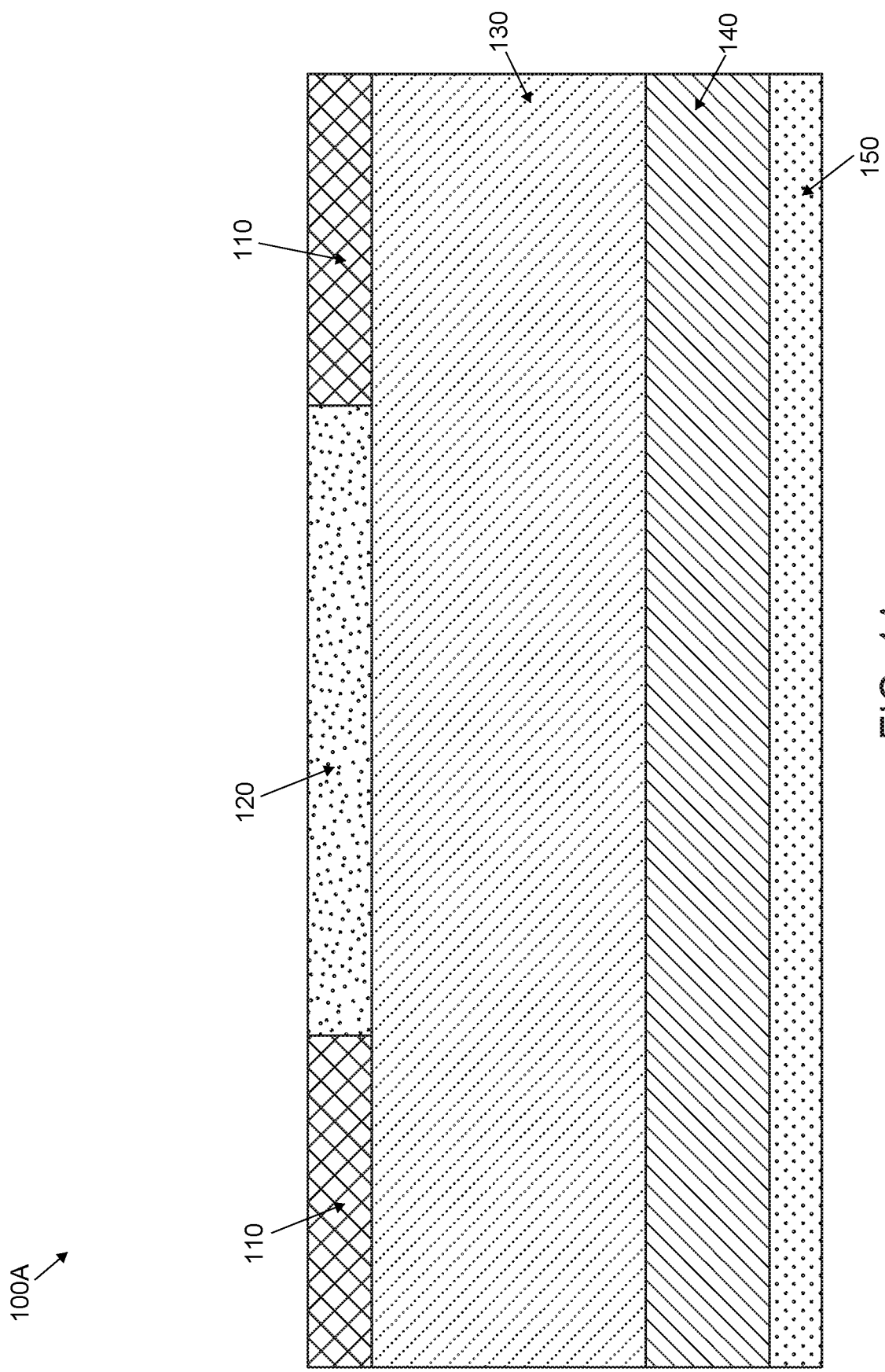

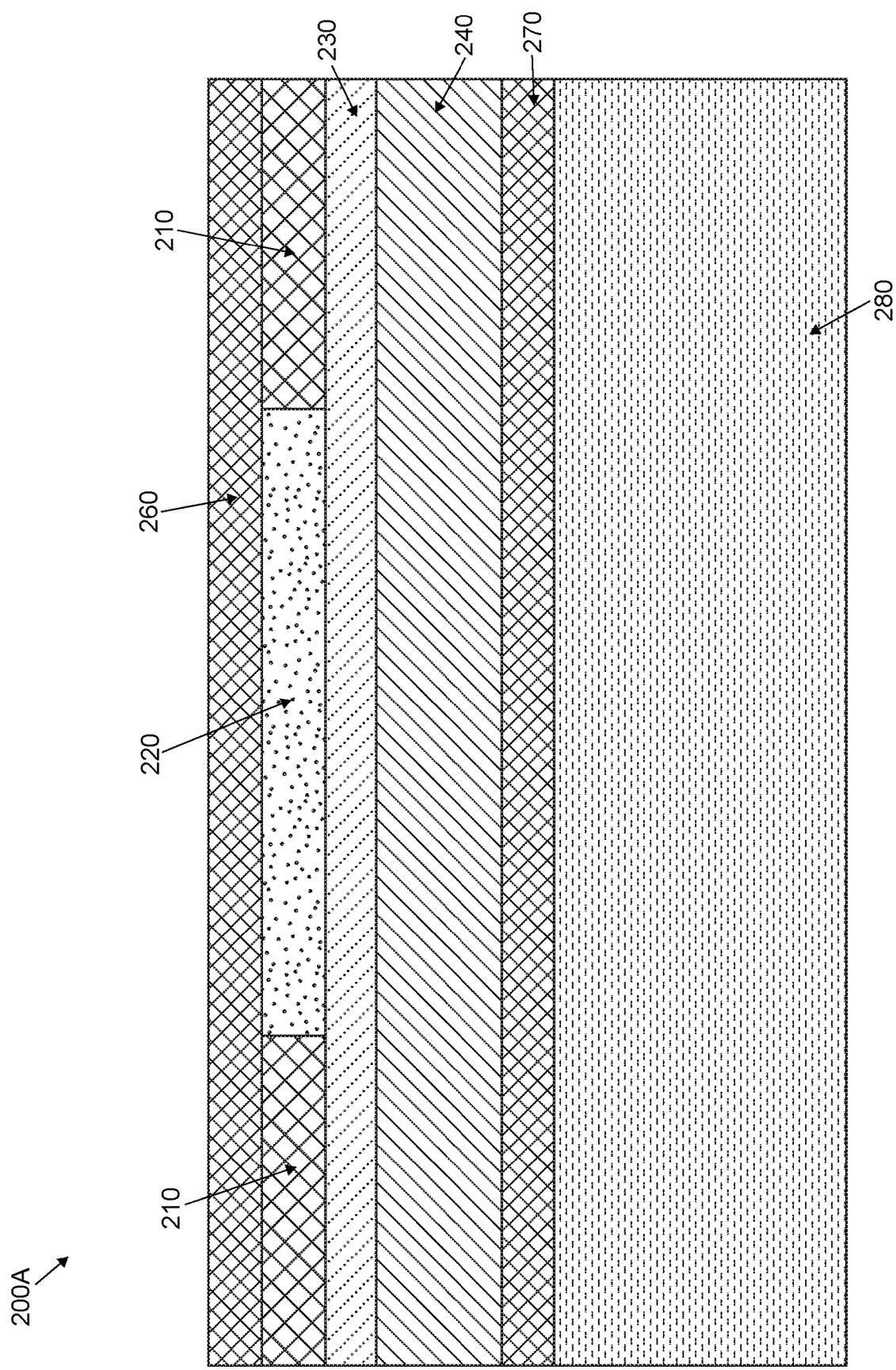

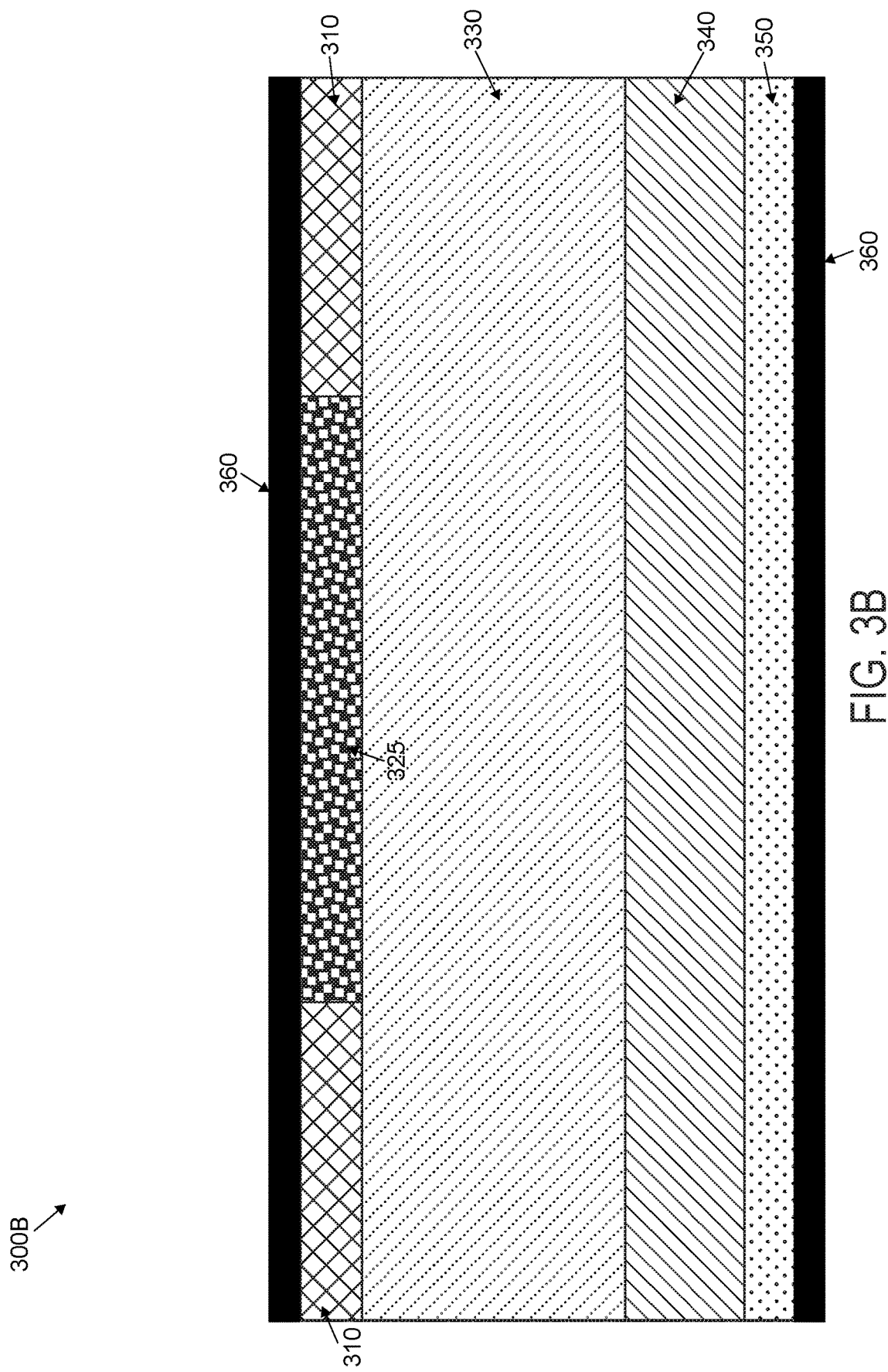

ured by an average unit cell period from about 10 nanometers to about 1 millimeter, such as from about 100
ELECTROCHEMICALLY TUNABLE, SOLID-STATE METAMATERIAL-BASED DEVICES

PRIORITY DATA

This patent application is a non-provisional application claiming priority to U.S. Provisional Patent App. No. 62/778,995, filed Dec. 13, 2018, which is hereby incorporated by reference herein.

STATEMENT REGARDING FEDERALLY SPONSORED RESEARCH OR DEVELOPMENT

This invention was made with Government support under U.S. Dept. of Defense DARPA Contract No. N66001-15-C-4027. The Government has certain rights in this invention.

FIELD OF THE INVENTION

The present invention generally relates to structures and materials containing tunable solid-state metamaterials, and methods of fabricating and using such metamaterials.

BACKGROUND OF THE INVENTION

A metamaterial is a material engineered to have a property that is not found in nature. Metamaterials are usually made from multiple repeat units fabricated from composite materials such as metals, ceramics, and/or plastics. The size, geometry, orientation, and arrangement of metamaterials enable manipulation of electromagnetic waves by blocking, absorbing, enhancing, or bending waves. Appropriately designed metamaterials can affect waves of electromagnetic radiation (e.g., UV, visible, and IR) or sound in a manner not observed in bulk materials.

The field of metamaterials has grown significantly over the past decade and shows potential for a multitude of applications. Potential applications of UV, visible, and IR metamaterials are diverse and include compact optics, optical filters, remote aerospace applications, sensor detection and infrastructure monitoring, solar power management, radomes, high-frequency battlefield communication and lenses for high-gain antennas, ultrasonic sensors, IR-absorbing and optical-absorbing materials, cloaking, angle-tunable optics, IR/thermal radiation control, and more.

Metamaterial-based devices include filters, modulators, amplifiers, transistors, and resonators, among others. The usefulness of a metamaterial-based device could be extended tremendously if the metamaterial's response characteristics can be dynamically tuned. However, metamaterials have been difficult to tune dynamically. There is a desire for tunability of metamaterials, and even complete reversibility such that the metamaterial itself can disappear (out of the active region) and reappear later, in a controllable manner.

Electrically tunable metamaterials arranged in a phased array allow light to be directed at different angles by a change in applied bias. Among the electro-optical approaches for such active phase-tuning metamaterials, several materials have been explored: highly doped semiconductors, transparent conducting oxides, phase-change materials, and two-dimensional materials such as graphene or transition-metal dichalcogenides. Many of these studies rely on ultrathin metasurfaces that have an exceedingly short interaction length with light and, to realize noticeable modulation, need highly tunable optical properties or resonant antenna structures.

Zheludev and Kivshar, "From metamaterials to metadevices", *Nature Materials* 11, 917-924 (2012) discuss electromechanical, thermomechanical, optomechanical, magnetomechanical, and stretched substrates; phase-change materials; electro-optical methods, and liquid crystals for tuning. However, tuning over a wide range of frequencies is difficult, and making the metamaterial completely disappear is impossible.

Thyagaraj an et al., "Millivolt Modulation of Plasmonic Metasurface Optical Response via Ionic Conductance", *Advanced Materials* 29, 31, Aug. 18, 2017 discuss tuning by forming a metal filament inside an ion conductor, not at the surface of the ion conductor. Furthermore, the metal material never completely disappears, i.e. is not physically removed.

In view of the aforementioned needs in the art, there is a desire for tunable metamaterials and plasmonic metamaterial-based devices that have low optical loss (less than 100 dB/micron and preferably less than 10 dB/micron) over a wide electromagnetic bandwidth. Typical metamaterials have a bandwidth of 1-5% of the resonant frequency. Metamaterials are desired that have a bandwidth of at least 5%, preferably at least 10%, and most preferably at least 30% of the resonant frequency for the metamaterial.

SUMMARY OF THE INVENTION

The present invention addresses the aforementioned needs in the art, as will now be summarized and then further described in detail below.

Some variations provide an electrochemically tunable, solid-state metamaterial-based device comprising a plurality of metamaterial unit cells, wherein each of the metamaterial unit cells comprises:
 (a) an ion conductor containing mobile metal ions;
 (b) a first electrode in contact with the ion conductor, wherein the first electrode is contained at least partially (e.g., completely) in a metasurface negative space disposed on the ion conductor;
 (c) a second electrode in contact with the ion conductor, wherein the second electrode is electrically isolated from the first electrode; and
 (d) a metal-containing region containing one or more metals, wherein the metal-containing region is contained at least partially (e.g., completely) within a metasurface positive space disposed on the ion conductor.

In some embodiments, the metal-containing region contains a porous electrode material, which may have the same or different composition compared to the first electrode.

In some embodiments, the metal-containing region further contains open space. The metal-containing region may be formed at or near a three-phase interface of the first electrode, the ion conductor, and open space.

In certain embodiments, the plurality of metamaterial unit cells forms an array of split-ring resonators each patterned in the metasurface positive space.

In certain embodiments, the plurality of metamaterial unit cells forms an array of crosses each patterned in the metasurface positive space.

The plurality of metamaterial unit cells may be characterized by an average unit cell period from about 10 nanometers to about 1 millimeter, such as from about 100 nanometers to about 1 micron, from about 1 micron to about 10 microns, from about 10 microns to about 1 millimeter, or another dimension.

The ion conductor may be opaque or transparent. Optionally, the first electrode is transparent and/or the second electrode is transparent.

In some embodiments, the ion conductor contains a material selected from the group consisting of β-alumina, β"-alumina, and combinations thereof, in addition to the mobile ions in the ion conductor. The mobile metal ions within the ion conductor may be selected from the group consisting of $Ag^{2+}$, $Na^+$, $K^+$, and combinations thereof.

In some embodiments, the first electrode is selected from the group consisting of a conductive metal oxide, a photoconductor, a gated semiconductor, and combinations thereof.

In some embodiments, the metal-containing region contains one or more metals within pores of the porous electrode material. In some embodiments, the metal-containing region consists essentially of the one or more metals.

The one or more metals (in the metal-containing region) may be selected from the group consisting of Ag, Na, K, and combinations thereof, e.g. reduced forms of the mobile metal ions contained in the ion conductor.

In some embodiments, the metasurface positive space is at the outer (top) surface of each of the metamaterial unit cells (e.g., see FIG. 1B). In other embodiments, the metasurface positive space is submerged within each of the metamaterial unit cells (e.g., see FIG. 2B and FIG. 3B). For example, each of the metamaterial unit cells may further comprise a transparent conducting layer disposed on the first electrode and on the metal-containing region, as depicted in FIG. 2B. Or, each of the metamaterial unit cells may further include a hermetic seal layer, as depicted in FIG. 3B.

The device may further comprise at least one reservoir in contact with the second electrode, wherein the reservoir is electrochemically configured to controllably supply or receive metal atoms. The reservoir may contain an intercalable compound, such as graphite, $MoS_2$, and/or $TaS_2$.

In some embodiments, the device is hermetically sealed, such as via a hermetic seal layer that encapsulated the entire device.

Other variations of the invention provide an electrochemically tunable, solid-state metamaterial-precursor device comprising a plurality of metamaterial-precursor unit cells, wherein each of the metamaterial-precursor unit cells comprises:
(a) an ion conductor that is conductive for mobile metal ions;
(b) a first electrode in contact with the ion conductor, wherein the first electrode is contained at least partially (e.g., completely) in a negative space disposed on the ion conductor;
(c) a second electrode in contact with the ion conductor, wherein the second electrode is electrically isolated from the first electrode; and
(d) a metamaterial-precursor region contained at least partially (e.g., completely) within a precursor positive space disposed on the ion conductor, wherein the precursor positive space contains a porous material or is open space.

The precursor positive space may contain some metal or may contain essentially no metal. In some embodiments, the precursor positive space is open space.

In some embodiments, the precursor positive space contains a porous, positive-space electrode material. Alternatively, or additionally, the precursor positive space contains a porous, inert scaffold material. Optionally, the porous positive-space electrode material has the same composition as the first electrode.

The plurality of metamaterial-precursor unit cells may be characterized by an average unit cell period from about 10 nanometers to about 1 millimeter.

The ion conductor may be opaque or transparent. In some embodiments, each of the first electrode and the second electrode is transparent.

The first electrode may be selected from the group consisting of a conductive metal oxide, a photoconductor, a gated semiconductor, and combinations thereof.

In some embodiments, the precursor positive space is at the outer (top) surface of each of the metamaterial-precursor unit cells (e.g., see FIG. 1A). In some embodiments, the precursor positive space is submerged within each of the metamaterial-precursor unit cells (e.g., see FIG. 2A or FIG. 3A). For example, each of the metamaterial-precursor unit cells may further comprise a transparent conducting layer disposed on the metamaterial-precursor region, as depicted in FIG. 2A. Or, each of the metamaterial-precursor unit cells may further comprise a hermetic seal layer, as depicted in FIG. 3A.

Optionally, the electrochemically tunable, solid-state metamaterial-precursor device further comprises at least one reservoir in contact with the second electrode, wherein the reservoir is electrochemically configured to controllably supply or receive metal atoms. The reservoir may contain an intercalable compound, such as graphite, $MoS_2$, and/or $TaS_2$.

BRIEF DESCRIPTION OF THE DRAWINGS

FIG. 1A is a cross-section schematic of an embodiment of an electrochemically tunable, solid-state metamaterial-based device designed to operate in reflection or absorption, where the device is in a metamaterial precursor state.

FIG. 2A is a cross-section schematic of an embodiment of an electrochemically tunable, solid-state metamaterial-based device designed to operate in transmission, where the device is in a metamaterial precursor state.

FIG. 3B is a cross-section schematic of an embodiment of a hermetically sealed, electrochemically tunable, solid-state metamaterial-based device designed to operate in reflection, where the device is in a metamaterial state.

DETAILED DESCRIPTION OF EMBODIMENTS OF THE INVENTION

Figure 1B:
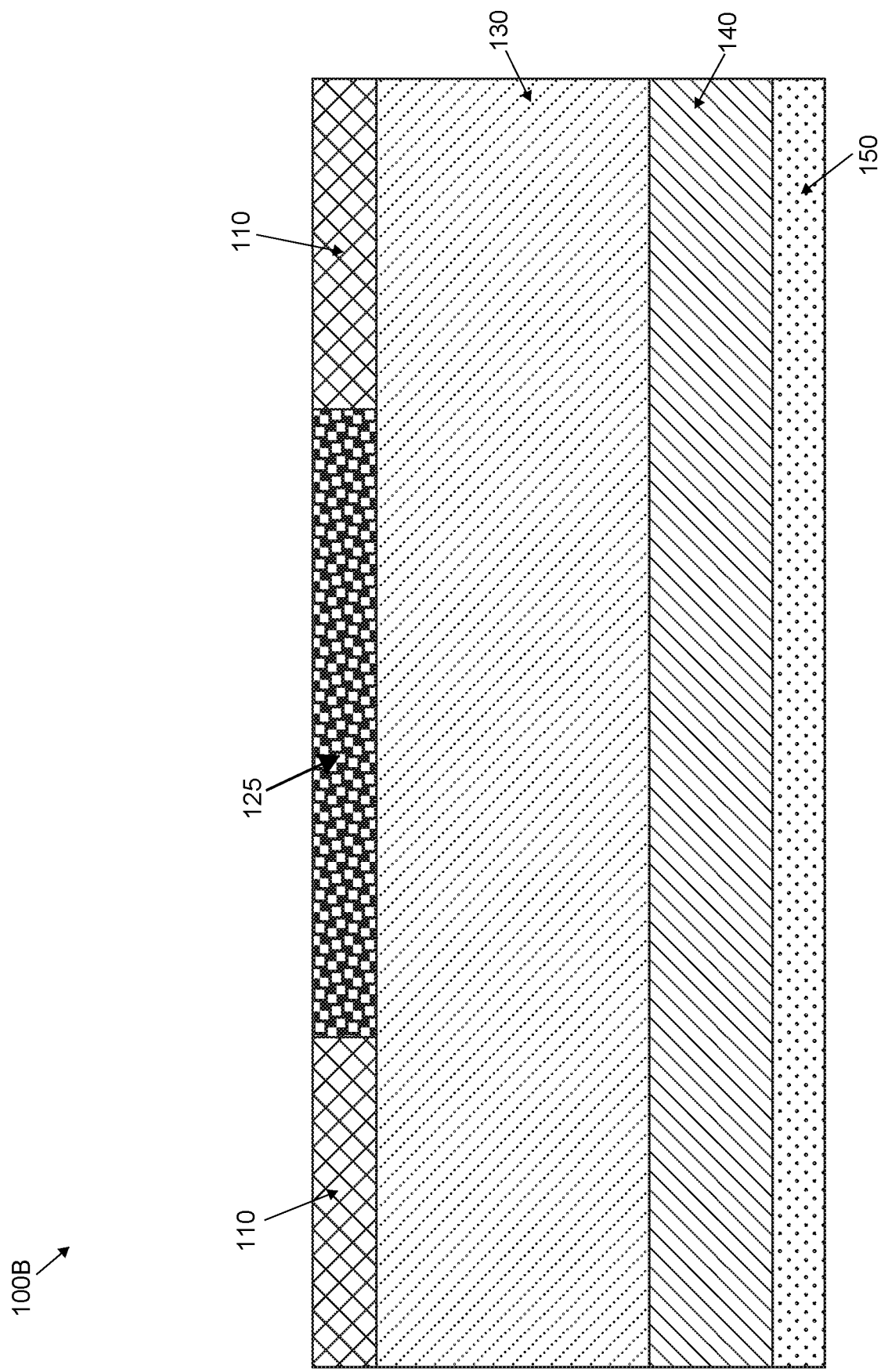
FIG. 1B is a cross-section schematic of an embodiment of an electrochemically tunable, solid-state metamaterial-based device designed to operate in reflection, where the device is in a metamaterial state.

The devices, structures, systems, and methods of the present invention will be described in detail by reference to various non-limiting embodiments.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phrase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phrase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms, except when used in Markush groups. Thus in some embodiments not otherwise explicitly recited, any instance of "comprising" may be replaced by "consisting of" or, alternatively, by "consisting essentially of."

The present invention provides an electrochemically tunable, solid-state metamaterial and metamaterial-based device. The metamaterial is formed and tuned by the electrochemical reduction of metal ions, into metal atoms, on one or more metasurfaces of a solid-state ion conductor. The metamaterial allows for the control of the transmission, absorption, and/or reflection spectra of electromagnetic waves that may be in the radio frequency, microwave, visible, or ultraviolet regions of the electromagnetic spectrum.

As used herein, a "metamaterial" is a material engineered to have one or more properties that are not naturally occurring. As used herein, a "metasurface" is one or more surfaces contained on or within a metamaterial, the metasurface being effective to provide the metamaterial property or properties. As used herein, a "metasurface positive space" is a metasurface region that contains one or more metals. As used herein, a "metasurface negative space" is a metasurface region that contains an electrode material that is different from the one or more metals in the metasurface positive space. The metasurface positive space and the metasurface negative space collectively form the metasurface. As used herein, a "metadevice" is a device or structure that utilizes a metamaterial precursor in a "metamaterial precursor state," and a metamaterial in a "metamaterial state," which device is capable of reversibility between the metamaterial precursor state and the metamaterial state. In a metamaterial precursor state, the device does not yet necessarily function as a metamaterial. In some embodiments, the device is referred to as metamaterial device, such as a plasmonic metamaterial device.

Among other things, the present invention enables the incorporation of alkali metals within metamaterials. Alkali metals (such as sodium and potassium) are known to have low optical loss, but heretofore were impossible to nanofabricate due to their high chemical reactivities. In contrast to the prior art, this invention, in some embodiments, permits the use of alkali metals in plasmonic metamaterials by performing device fabrication when the alkali metals are in the oxidized state as metal ions, contained within solid-state ionic conductors, and electrochemically reducing the alkali metal ions to their metallic form after the device or coating has been fully fabricated and hermetically sealed.

Furthermore, the ability to control the quantity of metal deposited (via electrochemical reduction) into a metasurface enables tuning of the equivalent resistance, capacitance, and inductance of metasurface elements, thereby tuning the frequency band of the metamaterial. Electrochemical oxidation of the metal in the metasurface elements may be conducted to oxidize the metal (into metal ions) and partially or fully dissolve the metal pattern, leaving no metamaterial. Complete removal of the metal pattern allows electromagnetic (e.g., optical) loss to be minimized when the metamaterial is not needed. The tuning via metal deposition by ion reduction, and metal dissolution by oxidation back to metal ions, is repeatable by application of a voltage of positive polarity followed at a later time by application of a voltage of negative polarity (opposite direction of electrical current), and so on for additional cycles. The number of atoms or ions that are reduced or oxidized during a tuning step, divided by the metasurface area, may be from about $10^{15}/cm^2$ to about $10^{22}/cm^2$, typically from about $10^{17}/cm^2$ to about $10^{19}/cm^2$, for example.

Variations of this invention are applicable to compact optics; optical filters; electromagnetic-absorbing materials; cloaking; infrared/thermal radiation control; switchable radar and infrared windows (e.g., switchable between a highly absorbing state and a low-loss transparent state); angle-tunable optics (such as for compact electro-optical/infrared optics); tunable daytime radiative cooling and heating windows; tunable and disappearing antennas; disappearing devices or substrates for military, banking, or other security applications; and photonic circuits and metamaterial computers, for example.

An aspect of the invention provides a metamaterial unit cell comprising:
  (a) an ion conductor containing mobile metal ions;
  (b) a first electrode in contact with the ion conductor, wherein the first electrode is contained at least partially in a metasurface negative space disposed on the ion conductor;
  (c) a second electrode in contact with the ion conductor, wherein the second electrode is electrically isolated from the first electrode; and (d) a metal-containing region containing one or more metals, wherein the metal-containing region is contained at least partially within a metasurface positive space disposed on the ion conductor.

Some variations provide an electrochemically tunable, solid-state metamaterial-based device comprising a plurality of metamaterial unit cells, wherein each of the metamaterial unit cells comprises:

(a) an ion conductor containing mobile metal ions;
(b) a first electrode in contact with the ion conductor, wherein the first electrode is contained at least partially in a metasurface negative space disposed on the ion conductor;
(c) a second electrode in contact with the ion conductor, wherein the second electrode is electrically isolated from the first electrode; and
(d) a metal-containing region containing one or more metals, wherein the metal-containing region is contained at least partially within a metasurface positive space disposed on the ion conductor.

FIG. 1A is a cross-section schematic of an embodiment of an electrochemically tunable, solid-state metamaterial-precursor device 100A designed to operate in reflection or absorption. In the device 100A, the first electrode 110 is patterned such that it is contained in a negative space disposed on ion conductor 130. A porous electrode 120 (e.g., nanoporous ITO), or alternatively open space 120, forms a metamaterial-precursor region contained within a precursor positive space disposed on the ion conductor 130 (e.g., β"-alumina) and interposed between regions of first electrode 110. The first electrode 110 and porous electrode or open space 120 collectively are on the outer surface of the device 100A, i.e., the ambient environment is outside the first electrode 110 and porous electrode or open space 120 on the side opposite the ion conductor 130. The ion conductor 130 is disposed on second electrode 140 (e.g., $AgTaS_2$), which is disposed on an opaque conductor 150 (e.g., copper).

FIG. 1B is a cross-section schematic of an embodiment of an electrochemically tunable, solid-state metamaterial-based device 100B designed to operate in reflection or absorption. In the device 100B, the first electrode 110 is patterned such that it is contained in a metasurface negative space disposed on ion conductor 130. Metal (e.g., silver) is patterned in a metal-containing region 125 contained within a metasurface positive space disposed on the ion conductor 130 and interposed between regions of first electrode 110. The first electrode 110 and metal-containing region 125 are collectively are on the outer surface of the device 100B. The ion conductor 130 is disposed on second electrode 140, which is disposed on an opaque conductor 150. The metal-containing region 125 may contain some of the material of the porous electrode 120 (from FIG. 1A), such as ITO.

The device may cycle between precursor state 100A and metamaterial state 100B any number of times, such as 1, 2, 5, 10, 20, 30, 40, or 50 times or more. The transition of the device from precursor state 100A (FIG. 1A) to metamaterial state 100B (FIG. 1B) takes place when the voltage at the second electrode 140 is higher than the voltage at the first electrode 110, to reduce metal ions into metal atoms in the metal-containing region 125. The transition back from metamaterial state 100B to precursor state 100A takes place when the voltage at the second electrode 140 is lower than the voltage at the first electrode 110, to oxidize metal into metal ions, which are transported away from the metal-containing region 125, which then becomes the porous electrode or open space 120 again. Exemplary voltage ranges and times are discussed below.

FIG. 2A is a cross-section schematic of an embodiment of an electrochemically tunable, solid-state metamaterial-precursor device 200A designed to operate in transmission. In the device 200A, the transparent first electrode 210 is patterned such that it is contained in a negative space disposed on transparent ion conductor 230 (e.g., <1 micron β"-alumina). A transparent porous electrode 220 (e.g., nanoporous ITO), or alternatively open space 220, forms a metamaterial-precursor region contained within a precursor positive space disposed on the transparent ion conductor 230 and interposed between regions of transparent first electrode 210. The transparent ion conductor 230 is disposed on transparent second electrode 240 (e.g., $V_2O_5$), which is disposed on a transparent conductor 270 (e.g., ITO). The transparent conductor 270 is disposed on a transparent substrate 280 (e.g., quartz). There is also a transparent top conductor 260 (e.g., ITO) that is disposed above the transparent first electrode 210 and the transparent porous electrode or open space 220. The transparent top conductor 260 is on the outer surface of the device 200A.

Figure 2B:
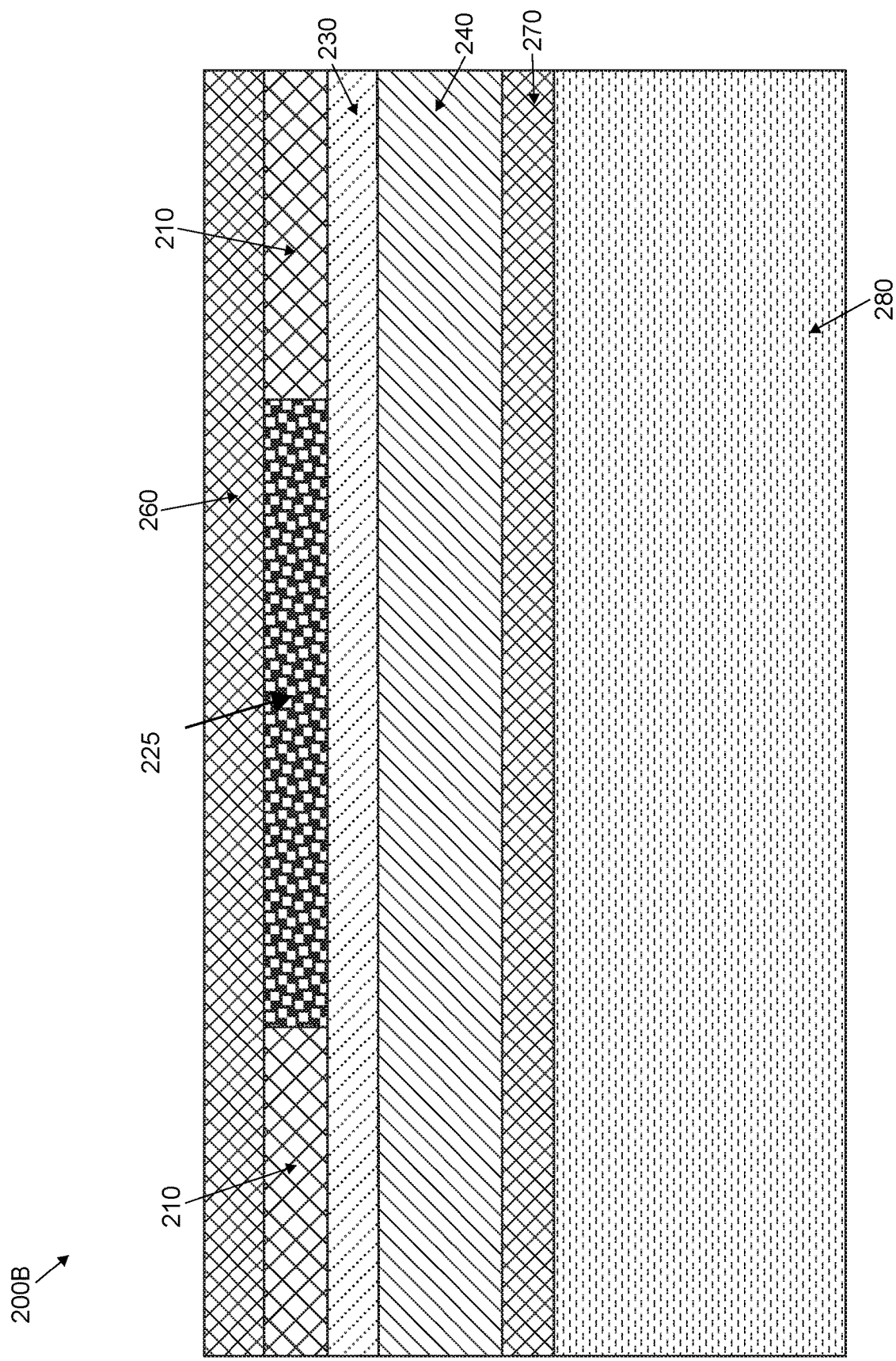
FIG. 2B is a cross-section schematic of an embodiment of an electrochemically tunable, solid-state metamaterial-based device designed to operate in transmission, where the device is in a metamaterial state.

FIG. 2B is a cross-section schematic of an embodiment of an electrochemically tunable, solid-state metamaterial-based device 200B designed to operate in transmission. In the device 200B, the transparent first electrode 210 is patterned such that it is contained in a metasurface negative space disposed on transparent ion conductor 230. Metal (e.g., silver) is patterned in a metal-containing region 225 contained within a metasurface positive space disposed on the ion conductor 230 and interposed between regions of first electrode 210, as well as being submerged under transparent conductor 260. The transparent top conductor 260 is on the outer surface of the device 200B. The transparent ion conductor 230 is disposed on transparent second electrode 240, which is disposed on an optional transparent conductor 270. Transparent conductor 270 is not necessary if transparent second electrode 240 has sufficient electrical conductivity. The transparent conductor 270, when present, is disposed on a transparent substrate 280. The transparent top conductor 260 is disposed above the transparent first electrode 210 and the transparent porous electrode or open space 220. The metal-containing region 225 may contain some of the material of the transparent porous electrode 220 (from FIG. 2A), such as ITO.

The device may cycle between precursor state 200A and metamaterial state 200B any number of times, such as 1, 2, 5, 10, 20, 30, 40, or 50 times or more. The transition of the device from precursor state 200A (FIG. 2A) to metamaterial state 200B (FIG. 2B) takes place when the voltage at the second electrode 240 is higher than the voltage at the first electrode 210, to reduce metal ions into metal atoms in the metal-containing region 225. The transition back from metamaterial state 200B to precursor state 200A takes place when the voltage at the second electrode 240 is lower than the voltage at the first electrode 210, to oxidize metal into metal ions, which are transported away from the metal-containing region 225, which then becomes the porous electrode or open space 220 again. Exemplary voltage ranges and times are discussed below.

Figure 3A:
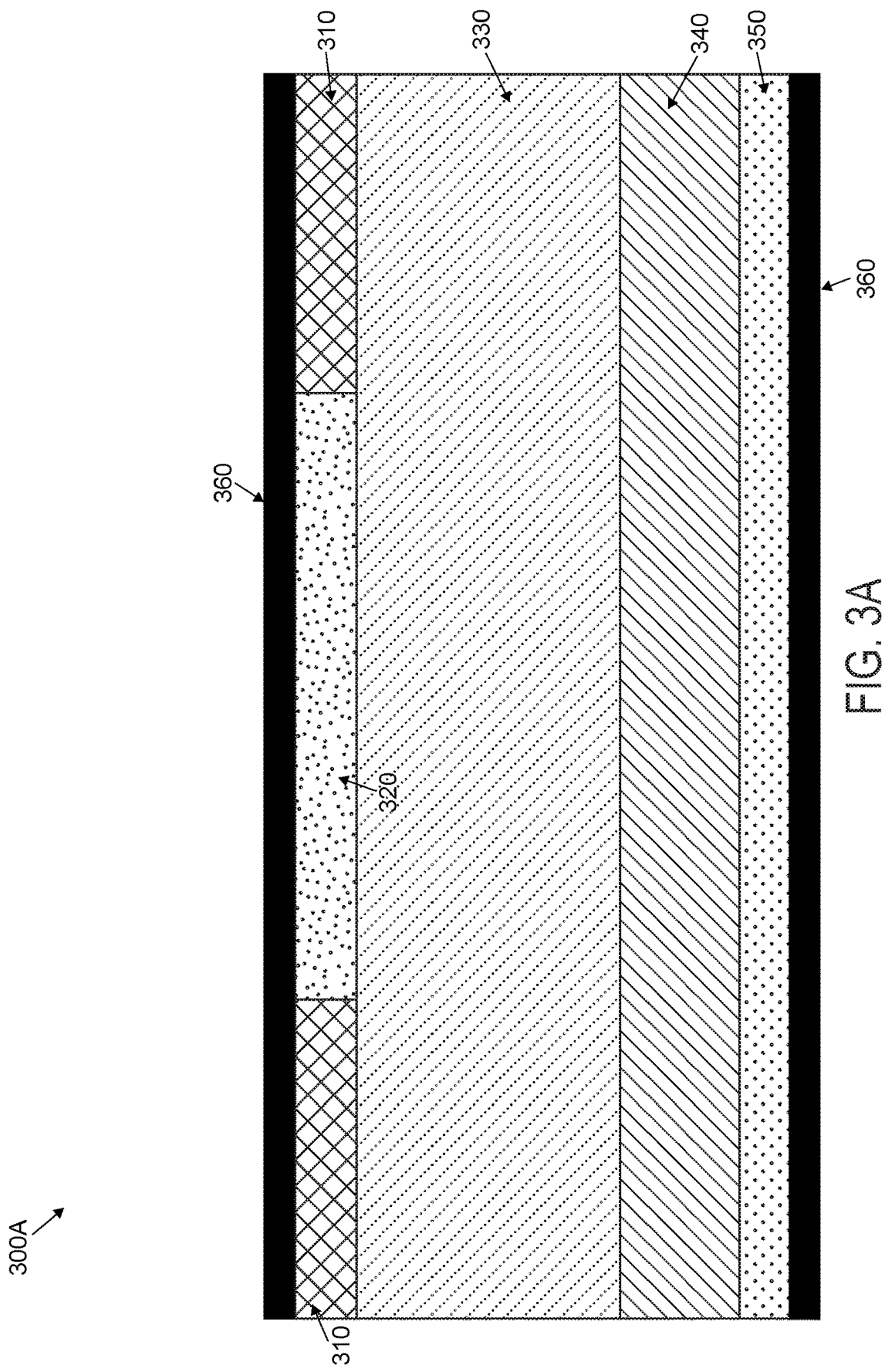
FIG. 3A is a cross-section schematic of an embodiment of a hermetically sealed, electrochemically tunable, solid-state metamaterial-based device designed to operate in reflection or absorption, where the device is in a metamaterial precursor state.

FIG. 3A is a cross-section schematic of an embodiment of a hermetically sealed, electrochemically tunable, solid-state metamaterial-precursor device 300A designed to operate in reflection or absorption. In the device 300A, the first electrode 310 is patterned such that it is contained in a negative space disposed on ion conductor 330. A porous electrode 320 (e.g., nanoporous ITO), or alternatively open space 320, forms a metamaterial-precursor region contained within a precursor positive space disposed on the ion conductor 330 (e.g., β"-alumina) and interposed between regions of first electrode 310. The ion conductor 330 is disposed on second electrode 140 (e.g., AgTaS$_2$), which is disposed on an opaque conductor 350 (e.g., copper). A hermetic seal layer 360 is above the first electrode 310 and porous electrode or open space 320, as well as below the opaque conductor 350, to seal the device from the environment. Note that because FIG. 3A is a cross-section of the device, the hermetic seal layer 360 is not shown on the sides of the structure, it being understood that all external sides of the structure would include the hermetic seal layer 360 to enable a hermetically sealed device.

FIG. 3B is a cross-section schematic of an embodiment of a hermetically sealed, electrochemically tunable, solid-state metamaterial-based device 300B designed to operate in reflection. In the device 300B, the first electrode 310 is patterned such that it is contained in a metasurface negative space disposed on ion conductor 330. Metal (e.g., silver) is patterned in a metal-containing region 325 contained within a metasurface positive space disposed on the ion conductor 330 and interposed between regions of first electrode 310. The ion conductor 330 is disposed on second electrode 340, which is disposed on an opaque conductor 350. The metal-containing region 325 may contain some of the material of the porous electrode 320 (from FIG. 3A), such as ITO. A hermetic seal layer 360 is above the first electrode 310 and porous electrode or open space 320, as well as below the opaque conductor 350, to seal the device from the environment. Note that because FIG. 3B is a cross-section of the device, the hermetic seal layer 360 is not shown on the sides of the structure, it being understood that all external sides of the structure would include the hermetic seal layer 360 to enable a hermetically sealed device.

The device may cycle between precursor state 300A and metamaterial state 300B any number of times, such as 1, 2, 5, 10, 20, 30, 40, or 50 times or more. The transition of the device from precursor state 300A (FIG. 3A) to metamaterial state 300B (FIG. 3B) takes place when the voltage at the second electrode 340 is higher than the voltage at the first electrode 310, to reduce metal ions into metal atoms in the metal-containing region 325. The transition back from metamaterial state 300B to precursor state 300A takes place when the voltage at the second electrode 340 is lower than the voltage at the first electrode 310, to oxidize metal into metal ions, which are transported away from the metal-containing region 325, which then becomes the porous electrode or open space 320 again. Exemplary voltage ranges and times are discussed below.

The second electrode 140/240/340 may function as an atom reservoir, when the material of the second electrode 140/240/340 includes graphite or another compound that is capable of intercalating and storing atoms. The transparent conductor 270 may also function as an atom reservoir, when the transparent conductor 270 is present (e.g., in FIGS. 2A and 2B). In some embodiments, an atom reservoir is interposed between the second electrode 140/340 and the opaque conductor 150/350 (FIGS. 1A, 1B, 3A, and 3B) or between the second electrode 240 and the transparent conductor 270 (FIGS. 2A and 2B) or, when there is no transparent conductor 270, between the second electrode 240 and the transparent substrate 280. An atom reservoir may alternatively be situated on one side of the device, and not integrated into the entire layer. The atom reservoir may be in any device location that allows electrochemical control, via the second electrode, to supply or receive metal atoms to or from the ion conductor.

Figure 4:
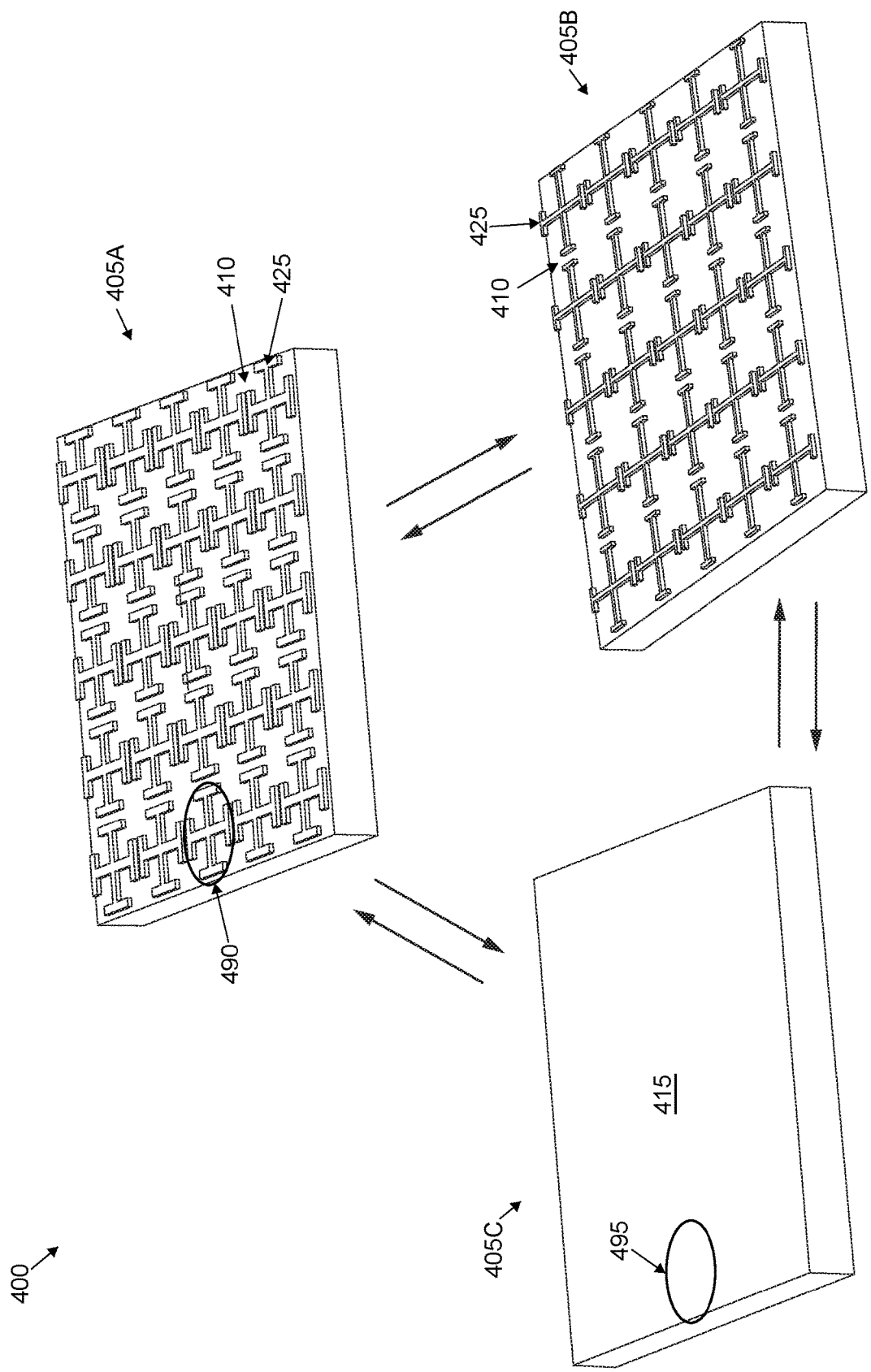
FIG. 4 depicts a metadevice (based on a plasmonic metamaterial) of some embodiments of the invention.

FIG. 4 depicts a metadevice 400 (based on a plasmonic metamaterial) of some embodiments of the invention. Metadevice 400 may exist in any number of states, three of which are shown for purposes of illustration as device states 405A, 405B, and 405C. Other states and intermediate states may be applicable.

In device state 405A, the surface of the device contains metal-containing regions 425 in a positive metasurface pattern, and first electrode regions 410 in a negative metasurface pattern. Element 410 corresponds to element 110 in FIGS. 1A and 1B, and element 425 corresponds to element 125 in FIGS. 1A and 1B. Submerged layers (e.g., ion conductor and second electrode) are not depicted in FIG. 4, for convenience of illustration. The metamaterial unit cell 490 of device 400 is an individual cross.

Following a period of metasurface dissolution, device state 405B contains smaller metal-containing regions 425 as well as the first electrode regions 410. The area derived from disappearance of a portion of a metal-containing region 425 becomes either a porous material without metal (e.g., a porous electrode) or open space, corresponding to element 120 in FIG. 1A. Finally, upon complete dissolution of metamaterial, device state 405C contains only an electrode material 415 (e.g., a porous electrode, such as nanoporous ITO) or a combination 415 consisting of electrode material and open space. The material or region 415 is a combination of elements 110 and 120 in FIG. 1A. The material or region 415 may be chemically uniform and may have physical features that are characteristic of the metasurface pattern that had been present prior to dissolution (i.e., in device states 405A and 405B).

Note that the metadevice 400 may incorporate transparent layers, as in the embodiment of FIGS. 2A and 2B. In this case, the top transparent layer is not shown in FIG. 4, so that metal-containing regions 425 (in a positive metasurface pattern) and first electrode regions 410 (in a negative metasurface pattern) can be viewed. In these embodiments, element 410 corresponds to element 210 in FIGS. 2A and 2B; element 425 corresponds to element 225 in FIGS. 2A and 2B; and element 415 corresponds to a combination of elements 210 and 220 in FIG. 2A.

Dynamic tuning and dissolution of the metadevice 400 may be employed, such as via continuous variation or intermittent tuning upon demand. As noted earlier, the number of atoms or ions that are reduced or oxidized during the tuning process, divided by the metasurface area, is typically from about $10^{17}/cm^2$ to about $10^{19}/cm^2$. Given a device design, finite-element software may be employed to simulate the resistance, capacitance, and inductance of the materials in device regions. For example, COMSOL Multiphysics® modeling software (Burlington, Mass., USA) may be employed to model the applied voltage necessary (e.g., from about 1-10 volts) and time necessary for the applied voltage (e.g., 0.1-1 second) to make the desired change to the frequency band of the metamaterial. Based on the device volume and volume of metamaterial present, the specific number of ions reduced to atoms (and in the reverse process, atoms oxidized to ions), may be readily calculated by one skilled in the art.

Also refer to Baena et al., "Equivalent-circuit models for split-ring resonators and complementary split-ring resonators coupled to planar transmission lines" *IEEE Transactions on Microwave Theory and Techniques*, Volume 53, Issue 4, pages 1451-1461 (April 2005), which is hereby incorporated by reference, for calculating resistance, capacitance, and inductance in metadevices incorporating split-ring resonators.

In the remainder of this disclosure, reference may be made to figure labels in FIG. 1A or FIG. 1B, it being understood that reference is implicitly made to equivalent elements in other drawings. For example, reference to first electrode 110 also includes reference to first electrode 210 in FIGS. 2A and 2B, as well as first electrode 310 in FIGS. 3A and 3B.

A voltage may be applied between the first electrode 110 and second electrode 140. Typical voltages are from about 1 V to about 10 V, although voltages as low as about 0.1 V or as high as about 500 V may be applied. In various embodiments, voltages of about 0.5, 1, 5, 10, 50, 100, 200, 300, 400, or 500 V are applied. The specific voltage or voltage range to be applied will depend on the electrochemical potential of the chemical reaction forming a metal ion from a given metal, the total amount of metal to be oxidized or reduced, and the desired adjustment to the frequency band of the metamaterial. Again, COMSOL Multiphysics® modeling software, or other software, may be employed to determine effective voltages for a given metal system.

If the voltage is higher at the second electrode 140 compared to the first electrode 110, metal atoms in the reservoir will be oxidized and transport into the ion conductor 130. Metal ions will transport within the ion conductor 130 from near the second electrode 140 to near the first electrode 110. Metal ions will reduce at the interface of the first electrode 110 and the ion conductor 130. The metal will begin to electroplate out at the edges of the first electrode 110. If the first electrode 110 is porous, the metal will begin to electroplate into the porous regions of the first electrode 110. If the first electrode 110 patterned features are close enough together (such as about 1 micron or smaller), the metal may eventually completely fill the space between the first electrode 110 (negative space) regions, become the metasurface positive space 125. The time for forming the metasurface positive space 125 varies, such as from about 1 microsecond to about 1000 seconds (e.g., about 0.1-1 seconds), depending on metamaterial thickness, applied voltage, and other factors.

If the voltage is lower at the second electrode 140 compared to the first electrode 110, metal will oxidize at the interface of the first electrode 110 and the ion conductor 130, and transport as metal ions into the ion conductor 130. If the voltage is high enough and sustained long enough, the entire metal pattern may be oxidized to ions and disappear from that region 125, the metal ions being conveyed to the reservoir. That is, metal ions will transport within the ion conductor 130 from near the first electrode 110 to near the second electrode 140. Metal ions will be reduced near the second electrode 140 and will be transported into the reservoir (140 or a separate region). The time for oxidizing the metal to dissolve the metasurface 125 varies, such as from about 1 microsecond to about 1000 seconds (e.g., about 0.1-1 seconds), depending on metamaterial thickness, applied voltage, and other factors.

A "metamaterial unit cell" 490 refers to the smallest region containing geometric features of the ion conductor 130, first electrode 110, second electrode 140, and metal-containing region 125, and from which the entire device 100B is obtained by unit-cell repetition. The distinction of an individual metamaterial unit cell can be arbitrary, depending on where lines of symmetry are drawn. For example, in FIG. 4, device state 405A, there are multiple, unique metamaterial unit cells that can be defined to characterize the metamaterial repeat pattern. A metamaterial unit cell may be a single cross 490, or may be one-half of a cross plus one-half of an adjacent cross, and so on. Also it is noted that the metal-containing region 125 is normally the characteristic feature defining a metamaterial unit cell 490. The ion conductor 130, first electrode 110, and second electrode 140 are typically physically continuous across the plurality of metamaterial unit cells 490, in the dimension that connects adjacent metamaterial unit cells 490.

The metamaterial unit-cell 490 repetition within a device may be in three dimensions, in two dimensions, or in one dimension. Typically, the unit-cell 490 repetition is in three dimensions. For example, the metamaterial unit cells 490 of FIG. 4 are depicted as being repeated in two dimensions (planar layers). These two-dimensional layers may be repeated in three dimensions, i.e. with multiple layers stacked together. Alternatively, the metamaterial unit cells 490 of FIG. 4 may be configured to have different orientations in different planes. For example, metamaterial unit cells 490 may be patterned into a series of parallel 2D arrays, or multiple arrays may exist in two to three orthogonal directions.

The number of metamaterial unit cells 490 may vary widely, such as from 1 to about 1,000 or more. The exemplary device of FIG. 4, for example, depicts 25 metamaterial unit cells 490. While it is in principle possible for a device or device component to contain only one metamaterial unit cell 490 (especially if it is large), it is preferred for the device or device component to contain a plurality of metamaterial unit cells 490.

In some embodiments, each of the metamaterial unit cells 490 is substantially identical. In other embodiments, there are at least two distinct types of metamaterial unit cells 490. In some embodiments, at least one of the metamaterial unit cells 490 is present as described, while other unit cells may be present that do not include all the limitations of the disclosed metamaterial unit cell 490 and/or may be a different type of unit cell (i.e., not a metamaterial unit cell 490).

The plurality of metamaterial unit cells 490 may be characterized by an average unit cell period from about 10 nanometers to about 1 millimeter, such as from about 100 nanometers to about 1 micron, from about 1 micron to about 10 microns, from about 10 microns to about 1 millimeter, or another dimension. A "unit cell period" is a dimension of length characterizing a unique three-dimensional unit cell, which dimension is usually the width (in the surface direction) of the unit cell. In the case of non-square unit cells, the unit cell period may be the square root of the unit-cell area. Metamaterial unit cells even larger than 1 millimeter are possible.

In some embodiments, the metal-containing region 125 contains a porous electrode material 120, which may have the same or different composition compared to the first electrode 110. The metal partially or completely fills the pores of the porous electrode material 120. The porosity of the porous electrode material 120 may vary widely, such as from about 1% to about 99%, preferably from about 10% to about 90%. The average pore size in the porous electrode material 120 may be less than 10 microns, preferably less than 1 micron, and more preferably less than 100 nanometers, such as about 5-50 nanometers. In some embodiments, the average pore size in the porous electrode material 120 is about 10 nanometers or less, such as 10, 9, 8, 7, 6, 5, 4, 3, or 2 nanometers.

In some embodiments, the metal-containing region 125 is configured parallel to the ion conductor 130, such as in a layered configuration (e.g., see FIG. 1B). In some embodiments, the metal-containing region 125 is configured perpendicular to the ion conductor 130, such that a thin region of metal is in contact with the ion conductor 130 and that region extends outward, in the direction away from the ion conductor 130, on a length scale that is larger than the length scale of the thin region 125 of metal contacting the ion conductor 130. A combination or intermediate configuration is possible, in which the metal-containing region 125 is configured as a curved region of material. For example, a metal-containing region 125 may contain some metal that is substantially parallel, some metal that is substantially perpendicular, and some metal that is disposed at an angle relative to the ion conductor 130.

In some embodiments, the metal-containing region 125 contains open space. The metal-containing region may be formed at or near a three-phase interface of the first electrode 110, the ion conductor 130, and the open space (which is derived from initially open space 120). A "three-phase interface" of the first electrode 110, the ion conductor 130, and open space is a spatial region at which the first electrode 110 is in contact with the ion conductor 130, and the first electrode—ion conductor contact region is further in contact with open space. In some embodiments, for example, the metal forms rings (or other outlines) around the perimeter of a metasurface positive space 125.

Many types of metamaterial patterns may be employed. The metamaterial pattern may be periodic, such as an array of dots or lines. The metamaterial pattern may consist essentially of a single feature, such as a full ring or a split ring. The metamaterial pattern may include concentric circles emanating from a dot or region. Intersecting or non-intersecting circles may be included on a metamaterial surface. A spiral pattern may be included on a metamaterial surface. Zig-zag patterns may be included on the metamaterial surface. In certain embodiments, metamaterial surface fractal patterns are utilized. Fractal patterns may be generated using an algorithm.

In certain embodiments, the plurality of metamaterial unit cells 490 forms an array of crosses each patterned in the metasurface positive space 125. The crosses may be perpendicular lines of metamaterial, with line thicknesses from 0.1 microns to 10 microns, and line lengths from 1 micron to 100 microns, for example.

In certain embodiments, the plurality of metamaterial unit cells 490 forms an array of split-ring resonators each patterned in the metasurface positive space. A split-ring resonator is a structure common to metamaterials. A split-ring resonator can produce a desired magnetic susceptibility (magnetic response). The split rings may be lines of metamaterial that form a split ring with a small gap in the ring, with line thicknesses from 0.1 microns to 10 microns, split-ring diameters from 1 micron to 100 microns, and gap sizes from 0.01 microns to 1 micron, for example.

The first electrode 110 in the metasurface negative space is typically disposed directly on the ion conductor 130. In certain embodiments, there is an intermediate layer (e.g., interfacial stability layer, a binding layer, or an inert layer) between the first electrode 110 and the ion conductor 130.

The ion conductor 130 contains mobile metal ions or is at least an effective ion-conducting material for mobile metal ions. In some embodiments or device states (such as an initial state or a cycling state), the mobile metal ions are not actually present within the ion conductor 130. For example, at a certain point in time, most or all of the metal ions may be in an atom reservoir 140.

The ion conductor 130 preferably has high ionic conductivity for an ionic species, such as higher than $10^{-7}$ S/cm, and preferably higher than $10^{-5}$ S/cm, measured at 25° C. The ionic conductivity of the ion conductor 130, measured at 25° C., is preferably about $10^{-9}$ S/cm or higher, more preferably about $10^{-7}$ S/cm or higher, or about $10^{-5}$ S/cm or higher. In various embodiments, the ionic conductivity of the ion conductor 130 at 25° C. is about $10^{-8}$ S/cm, $10^{-7}$ S/cm, $10^{-6}$ S/cm, $10^{-5}$ S/cm, $10^{-4}$ S/cm, $10^{-3}$ S/cm, or $10^{-2}$ S/cm. In some embodiments, the device 100A/100B includes a heater, to increase the ion conductivity of the ion conductor 130.

The ion conductor 130 preferably comprises or consists essentially of a solid electrolyte. For example, the ion conductor 130 may include a large fraction (e.g., at least 50 wt %) β-alumina, β"-alumina, or a combination thereof. In some embodiments, the ion conductor 130 comprises a material selected from the group consisting of β-alumina, β"-alumina, and combinations thereof. In some embodiments employing β"-alumina, the ion conductor 130 when loaded with metal ions contains Na-β"-alumina, K-β"-alumina, Rb-β"-alumina, Cs-β"-alumina, Sr-β"-alumina, Ca-β"-alumina, or a combination thereof.

β-alumina and β"-alumina are good conductors of their mobile ions yet allow negligible non-ionic (i.e., electronic) conductivity. β"-alumina is a hard polycrystalline or monocrystalline ceramic which, when prepared as an electrolyte, is complexed with a mobile ion, such as $Rb^+$, $Cs^+$, $Ca^{2+}$, $Na^+$, $K^+$, $Sr^{2+}$, and $Yb^{3+}$, e.g. an ionic version of an alkali or alkaline earth metal. β-alumina and/or β"-alumina are also referred to herein as "beta-alumina." Beta-alumina solid electrolyte is a fast ion-conductor material used as a membrane in several types of electrochemical cells.

Alternative ionic conductors 130 include, but are not limited to, NASICON, LISICON, KSICON, yttria-stabilized zirconia, alkali ion-exchanged versions of the foregoing, and combinations thereof. Ionic conductors may alternatively, or additionally, include chalcogenide glasses, such as $RbI$—$GeSe_2$—$Ga_2Ge_3$ and/or $CsI$—$GeSe_2$—$Ga_2Ge_3$.

The ion conductor 130 may be opaque or transparent. For example, a transparent ion conductor 230 may be a thin (e.g., <10 micron) layer of beta-alumina or of an ion conductor typically employed in electrochromics (e.g., $LiAlF_4$, $Ta_2O_5$, $V_2O_5$, $WO_3$, etc.).

The mobile metal ions may be selected from the group consisting of $Ag^{2+}$, $Na^+$, $K^+$, and combinations thereof. It is noted that the present invention is not limited to these metals or to silver or alkali metals. The invention may generally utilize alkali metals (e.g., Li, Na, K, Rb, or Cs), alkaline earth metals (e.g., Be, Mg, Ca, Sr, or Ba), or other metals (e.g., Ag, Yb, or Hg). The mobile metal ions may in principle be ions of any metal atom.

The first electrode 110 permits the conduction of electrons. The first electrode 110 is at least a fair electrical conductor. In some embodiments, the electrical resistivity of the first electrode 110 is preferably less than 10 kΩ·cm, more preferably less than 1 kΩ·cm, and most preferably less than 1 Ω·cm, measured at 25° C. The electrical resistivity of the first electrode 110 is optionally adjusted, such as by heating.

The first electrode 110 is in contact with the ion conductor 130 but is not necessarily ionically conductive for the mobile metal ions. In some embodiments, the ion conductor 130 is not substantially ionically conductive for the mobile metal ions, which means that the first electrode 110 has an ionic conductivity for the mobile metal ions that are in the ionic conductor 130 less than $10^{-9}$ S/cm, less than $10^{-10}$ S/cm, less than $10^{-11}$ S/cm, or less than $10^{-12}$ S/cm, measured at 25° C. In some embodiments, the first electrode 110 is an "ion-blocking electrode," which means that the ionic conductivity is about $10^{-12}$ S/cm or lower, measured at 25° C. or at the device operating temperature, such as 100° C., 200° C., 300° C., 400° C., 500° C., or higher. In other embodiments, the first electrode 110 has an ionic conductivity for the mobile metal ions that are in the ionic conductor greater than $10^{-9}$ S/cm, greater than $10^{-8}$ S/cm, greater than $10^{-7}$ S/cm, greater than $10^{-6}$ S/cm, or greater than $10^{-5}$ S/cm, measured at 25° C.

The first electrode 110 is preferably patterned in the negative space of the desired metal-containing metasurface 125. The patterned features may themselves be porous.

Optionally, the first electrode 110 is transparent. A transparent first electrode 210 preferably is transparent at the wavelengths of operation of the metasurface. For example, for an optical metamaterial, indium tin oxide or another transparent conductive oxide may be used in the first electrode 210. Alternatively, the first electrode 210 may have switchable electrical conductivity (e.g. a photoconductor or a gated semiconductor).

In some embodiments, the first electrode 110 is selected from the group consisting of a conductive metal oxide, a photoconductor, a gated semiconductor, and combinations thereof. A photoconductor is a material that has increased electrical conductivity when exposed to light. Examples of photoconductor include, but are not limited to, selenium and lead sulfide. Examples of gated semiconductors include, but are not limited to, silicon-based metal-oxide-semiconductor field-effect transistors.

The first electrode 110 may be a uniform layer or a non-uniform layer. The thickness of the first electrode 110 is preferably less than 500 μm and more preferably less than 100 μm. In various embodiments, the thickness of the first electrode 110 is about 1 nm, 10 nm, 100 nm, 1 μm, 10 μm, 100 μm, 500 μm, or more.

The first electrode 110 may be a porous electrically conductive layer, which may be an electrically conductive, patterned metal layer directly on a surface of the ion conductor 130, for example. The metal layer is preferably thin, such as less than 1 micron, preferably less than 200 nm, and more preferably less than 100 nm. The metal layer may be patterned in a closely spaced configuration, such as less than 100 micron line pitch, preferably less than 10 micron line pitch, and more preferably less than 2 micron line pitch. The metal layer (first electrode 110) may be patterned with photolithography, electron-beam lithography, direct-write lithography, direct-write metal deposition (e.g. ion beam-induced deposition), interference lithography, or another technique.

The first electrode 110 may be designed to have a large amount of three-phase contact length or interfacial contact area. The three phases are electrode 110, ion conductor 130, and open space 120. Configurations that may accomplish high three-phase contact include a high-density mesh or grid pattern, a porous material with an open porosity, a high-density parallel line pattern, or a nanowire array, for example.

Exemplary first electrode 110 materials include Pt, Mo, and W, for example. Another exemplary material for the first electrode 110 is indium tin oxide (ITO). The porous electrically conductive layer 110 may also entail more than one layer, such as a Ti adhesion layer and a Pt layer.

The second electrode 140 also permits the conduction of electrons. The second electrode 140 is at least a fair electrical conductor. In some embodiments, the electrical resistivity of the second electrode 140 is preferably less than 10 kΩ·cm, more preferably less than 1 kΩ·cm, and most preferably less than 1 Ω·cm, measured at 25° C.

The second electrode 140 is preferably in direct contact with the ion conductor 130 but is not in contact with the first electrode 110. That is, the second electrode 140 is "electrically isolated" from the first electrode 110, which means that electrons cannot flow directly from the first electrode 110 to the second electrode 140, although charge can flow in the form of electrons while in one electrode, then ions while in the ion conductor 130, then electrons while in the other electrode.

Also, electrical communication between electrodes 110, 140 is possible through an external circuit. Each electrode 110, 140 is typically connected to an electrical lead, when the device 100A/100B is used. Dielectric materials may be employed to isolate and electrically insulate the electrodes 110, 140 from other parts of the system.

In some embodiments, the second electrode 140 is not in direct contact with the ion conductor 130 but rather is in ionic communication with the ion conductor 130. By "ionic communication" between the ion conductor 130 and the second electrode 140, it is meant that ions, or their neutral forms, are capable of being transported between the ion conductor 130 and the second electrode 140 (not necessarily within the second electrode 140). In some embodiments, there is an additional layer between the second electrode 140 and the ion conductor 130, which layer is ionically conductive so that there is ionic communication between the ion conductor 130 and second electrode 140. Note that in some embodiments, ions (i.e. positively or negatively charged atoms) may be neutralized at the interface between the ion conductor 130 and the second electrode 140, so that ions (e.g., as $Rb^+$ or $Na^+$) do not leave the ion-conducting layer 130, but rather neutralized forms of the ions (e.g., Rb or Na) are transported away from the ion conductor 130.

The second electrode 140 may be fabricated from common electrode materials including, but not limited to, Pt, Mo, W, Ni, Cu, Fe, and Al. Another exemplary material for the second electrode 140 is $AgTaS_2$. In some embodiments, the second electrode 140 contains an intercalable compound that is capable of being intercalated by a metal ion. The intercalable compound may be carbon, for example. In some embodiments, the second electrode 140 includes more than one layer, such as a Ti adhesion layer and a Pt layer, or a Cu layer and a graphite layer, for example.

The second electrode 140 may be a uniform layer or a non-uniform layer. The thickness of the second electrode 140 may be less than 500 μm or less than 100 μm. In various embodiments, the thickness of the second electrode 140 is about 1, 5, 10, 20, 30, 40, 50, 75, 100, 200, or 500 μm.

The second electrode 140 may be solid or porous. In some embodiments, the second electrode 140 is transparent, such as $V_2O_5$.

Each electrode 110, 140 is typically connected to an electrical lead fabricated from an electrically conductive material. A lead is an electrical connection consisting of a length of wire, metal pad, metal trace, or other electrically conductive structure. Leads are used to transfer power and may also provide physical support and potentially provide a heat sink. In some embodiments, a device is provided without such leads, which may be added at a later time, before use.

In some embodiments, the metal-containing region 125 contains one or more metals within (e.g., plated on surfaces of) pores of the porous electrode material 120. That is, in these embodiments, the metal-containing region 125 is a porous electrode material 120 with metal contained in the pores.

In some embodiments, the metal-containing region 125 consists essentially of the one or more metals. These embodiments can result when the precursor positive space is open space. In related embodiments, the metal-containing region 125 consists essentially of open space and the one or more metals. These embodiments can also result when the precursor positive space is open space, and when the metal-containing region 125 is formed at an interface of the first electrode 110, the ion conductor 130, and the open space—but does not completely fill in the open space.

The one or more metals (in the metal-containing region 125) may be selected from the group consisting of Ag, Na, K, and combinations thereof, e.g. reduced forms of the mobile metal ions contained in the ion conductor 130.

In some embodiments, the metasurface positive space is at the outer surface of each of the metamaterial unit cells 490 (e.g., see FIG. 1B and FIG. 4). In other embodiments, the metasurface positive space is submerged within each of the metamaterial unit cells (e.g., see FIG. 2B or FIG. 3B). For example, each of the metamaterial unit cells may further comprise a transparent conducting layer (such as indium tin oxide) disposed on the first electrode 210 and on the metal-containing region 225, as depicted in FIG. 2B.

The device may further comprise at least one reservoir in contact with the second electrode 140, wherein the reservoir is electrochemically configured to controllably supply or receive metal atoms. Metal ions, or their neutral forms, are capable of being transported between the atom reservoir and the ion conductor.

The reservoir may contain an intercalable compound, such as graphitic carbon. The reservoir may be disposed in intimate contact with, i.e. an integral part of, the second electrode 140. The atom reservoir may be integrated with the second electrode 140. Stated another way, the second electrode 140 may contain a source of replacement ions for the ion conductor 130. For example, the atom reservoir may comprise, in part or in whole, graphite or graphitic carbon (e.g., graphene). The graphite or graphitic carbon provides electrical conductivity and also a means of storing atoms, such as via a graphite intercalation compound, when the device is in the metamaterial precursor state. Other intercalable compounds may be used, such as metal dichalcogenides (e.g., $MoS_2$ and/or $TaS_2$), metal oxides (e.g., cobalt oxides, nickel oxides, and/or manganese oxides), or combinations thereof. In other embodiments, the second electrode contains an intermetallic containing replacement metal atoms, or a solid or liquid elemental form of a metal, for example.

The atomic species contained within the reservoir 140 is preferably the reduced form of the same ionic species as in the ion conductor 130. Alternatively, a different atomic species may be contained within the reservoir 140.

In certain embodiments, a reservoir is in contact with an opaque conductor 150 that is itself in contact with the second electrode 140.

The atom reservoir may have walls that are preferably impermeable to the atomic species contained inside the reservoir, to avoid unintentional loss of atoms out of the reservoir. The side of a reservoir wall that faces the interior of the reservoir preferably does not chemically interact with the ionic species, e.g., does not form an intermetallic phase and does not chemically react with the ionic species. The side of a reservoir wall that touches the ionic conductor, if any, preferably does not chemically interact with the ion conductor, other than possible chemical bonding to adhere to the ionic conductor. Preferably, the wall does not form mobile ions that are transported within the ion conductor 130. Exemplary materials for the include atom reservoir walls include Pt, Mo, W, or a combination thereof.

The entire device may be hermetically sealed, such as with a hermetic seal layer 360. The purpose of the hermetic seal layer 360 is to encapsulate the device 300A/300B to protect it from the environment and reduce heat loss from the device 300A/300B. The hermetic seal layer 360 is optional; whether it is desirable depends to a large extent on the identity of the metal ions contained within the ion conductor 130. For example, when the metal ions are silver ions, a hermetic seal layer 360 is not necessary. When the metal ions are sodium ions, it is preferred to include a hermetic seal layer 360, due to the thermodynamic and transport properties of sodium.

The material of the hermetic seal layer 360 may be a polymer or a ceramic that is at least partially transparent at frequencies for which the device exhibits metamaterial properties. The hermetic seal layer 360 may be applied by physical vapor deposition (e.g., evaporation or sputtering), chemical vapor deposition, atomic layer deposition, dip coating, spray coating, or other techniques known in the art.

Note that the oxidation and reduction steps are performed within the device by electrical current applied to electrodes 310, 340, not by chemical oxidation or reduction from external species (e.g., $O_2$ or $H_2$). Therefore, the presence of the hermetic seal layer 360 causes no problem from the standpoint of oxidation and reduction of the metal and metal ions, respectively, to remove or create the metamaterial.

Another aspect of the invention relates to a metamaterial-precursor unit cell, which is a unit cell that lacks an effective amount of metal to function as a metamaterial. Some embodiments provide a metamaterial-precursor unit cell comprising:

(a) an ion conductor that is conductive for mobile metal ions;

(b) a first electrode in contact with the ion conductor, wherein the first electrode is contained at least partially in a negative space disposed on the ion conductor, and wherein the first electrode is not substantially ionically conductive for the mobile metal ions;

(c) a second electrode in contact with the ion conductor, wherein the second electrode is electrically isolated from the first electrode; and (d) a metamaterial-precursor region contained at least partially within a precursor positive space disposed on the ion conductor, wherein the precursor positive space contains a porous material or is open space.

Some variations of the invention provide an electrochemically tunable, solid-state metamaterial-precursor device comprising a plurality of metamaterial-precursor unit cells, wherein each of the metamaterial-precursor unit cells comprises:

(a) an ion conductor that is conductive for mobile metal ions;

(b) a first electrode in contact with the ion conductor, wherein the first electrode is contained at least partially in a negative space disposed on the ion conductor, and wherein the first electrode is not substantially ionically conductive for the mobile metal ions;

(c) a second electrode in contact with the ion conductor, wherein the second electrode is electrically isolated from the first electrode; and (d) a metamaterial-precursor region contained at least partially within a precursor positive space disposed on the ion conductor, wherein the precursor positive space contains a porous material or is open space.

A "metamaterial-precursor unit cell" 495 refers to the smallest region containing geometric features of the ion conductor 130, first electrode 110, second electrode 140, and metamaterial-precursor region 120, and from which the entire device is obtained by unit-cell 495 repetition in three dimensions. It is noted that the metamaterial-precursor region (pattern of precursor positive space) is normally the characteristic feature defining a metamaterial-precursor unit cell. The ion conductor 130, first electrode 110, and second electrode 140 are typically physically continuous across the plurality of metamaterial-precursor unit cells 495, in the dimension that connects adjacent metamaterial-precursor unit cells 495.

The plurality of metamaterial-precursor unit cells 495 may be characterized by an average unit cell period from about 100 nanometers to about 1 millimeter.

The number of metamaterial-precursor unit cells 495 may vary widely, such as from 1 to about 1,000 or more. The exemplary device of FIG. 4, for example, implies 25 metamaterial-precursor unit cells 495; in the device state 405C, the unit cells 495 may no longer be distinguishable as are unit cells 490 (in device states 405A or 405B) since all metal has been dissolved away, as depicted in this drawing.

A metamaterial-precursor unit cell 495 becomes a metamaterial unit cell 490, upon electrochemical reduction and deposition of metal ions derived from the ion conductor 130. In certain embodiments, less than all of the metamaterial-precursor unit cells 495 are converted to metamaterial unit cells 490, or likewise, less than all of the metamaterial unit cells 490 are converted back to metamaterial-precursor unit cells 495. Each of these situations will result in a mix of metamaterial-precursor unit cells 495 and metamaterial unit cells 490, within the device 400.

The precursor positive space may contain some metal or may contain essentially no metal. In some embodiments, the precursor positive space is open space.

In some embodiments, the precursor positive space contains a porous, positive-space electrode material 120. Alternatively, or additionally, the precursor positive space contains a porous, inert scaffold material 120. Optionally, the porous positive-space electrode material 120 has the same composition as the first electrode 110. For example, the porous positive-space electrode material 120 may be nanoporous ITO.

The options for materials of the ion conductor 130, first electrode 110, and second electrode 140 are the same for the metamaterial-precursor device as for the metamaterial-based device described above. During the transition between metamaterial precursor and metamaterial (in either direction), chemical reactions take place in the ion conductor 130, first electrode 110, second electrode 140, and/or other regions of the device.

In some embodiments, the precursor positive space is at the outer surface of each of the metamaterial-precursor unit cells 495 (e.g., see FIG. 1A). In some embodiments, the precursor positive space is submerged within each of the metamaterial-precursor unit cells 495 (e.g., see FIG. 2A or FIG. 3A). For example, each of the metamaterial-precursor unit cells 495 may further comprise a transparent conducting layer 260 (such as indium tin oxide) disposed on the metamaterial-precursor region 220, as depicted in FIG. 2A.

The device 100A/100B may be operated at a wide range of operating temperatures, including about 25° C., less than 25° C., or greater than 25° C. In some embodiments, a high-temperature, electrochemically tunable, solid-state metamaterial-based device 100A/100B is capable of operating at an operating temperature of about, or at least about, 50° C., 100° C., 200° C., 300° C., 400° C., 500° C., 600° C., 700° C., 800° C., 900° C., 1000° C., or higher.

The device 100A/100B may contain a sub-device for controlling the electrical conductivity of the first electrode 110. For example, a sub-device may comprise a UV light-emitting diode, such as a ZnO-based material, for exciting photoconductor carriers. Multiple ion conductors, each with their own electrodes, may be present in one device 100A/100B. Multiple sets of first electrodes, ion conductors, and second electrodes may be present in a single device 100A/100B.

The device 100A/100B may be implemented at a number of length scales. The length scale may be characterized as the square root of the first electrode 110 area. The length scale could may vary widely, such as from 10 microns to 100 meters.

An array of devices 100A/100B of the invention may be part of a larger system. Also, a device 100A/100B of the invention may be present along with any number of other devices or components that are known in the art, such as electrical circuits, thermocouples, pressure sensors, and so on.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. An electrochemically tunable, solid-state metamaterial-based device comprising a plurality of metamaterial unit cells, wherein each of said metamaterial unit cells comprises:
   (a) an ion conductor containing mobile metal ions;
   (b) a first electrode in contact with said ion conductor, wherein said first electrode is contained at least partially in a metasurface negative space disposed on said ion conductor;
   (c) a second electrode in contact with said ion conductor, wherein said second electrode is electrically isolated from said first electrode; and
   (d) a metal-containing region containing one or more metals, wherein said metal-containing region is contained at least partially within a metasurface positive space disposed on said ion conductor.

2. The device of claim 1, wherein said plurality of metamaterial unit cells forms an array of split-ring resonators each patterned in said metasurface positive space.

3. The device of claim 1, wherein said plurality of metamaterial unit cells forms an array of crosses each patterned in said metasurface positive space.

4. The device of claim 1, wherein said plurality of metamaterial unit cells is characterized by an average unit cell period from about 10 nanometers to about 1 millimeter.

5. The device of claim 1, wherein said ion conductor comprises a material selected from the group consisting of β-alumina, β"-alumina, and combinations thereof.

6. The device of claim 1, wherein said mobile metal ions are selected from the group consisting of $Ag^{2+}$, $Na^+$, $K^+$, and combinations thereof.

7. The device of claim 1, wherein said first electrode is selected from the group consisting of a conductive metal oxide, a photoconductor, a gated semiconductor, and combinations thereof.

8. The device of claim 1, wherein said metal-containing region consists essentially of said one or more metals.

9. The device of claim 1, wherein said one or more metals are selected from the group consisting of Ag, Na, K, and combinations thereof.

10. The device of claim 1, wherein said metasurface positive space is at an outer surface of each of said metamaterial unit cells.

11. The device of claim 1, wherein said metasurface positive space is submerged within each of said metamaterial unit cells.

12. The device of claim 1, wherein each of said metamaterial unit cells further comprises a transparent conducting layer disposed on said first electrode and on said metal-containing region.

13. The device of claim 1, wherein said device is hermetically sealed.

14. The device of claim 1, wherein said metal-containing region contains a porous electrode material.

15. The device of claim 14, wherein said porous electrode material has the same composition as said first electrode.

16. The device of claim 14, wherein said metal-containing region contains said one or more metals within pores of said porous electrode material.

17. The device of claim 1, wherein said metal-containing region further contains open space.

18. The device of claim 17, wherein said metal-containing region is formed at or near a three-phase interface of said first electrode, said ion conductor, and said open space.

19. The device of claim 1, said device further comprising at least one reservoir in contact with said second electrode, wherein said reservoir is electrochemically configured to controllably supply or receive metal atoms.

20. The device of claim 19, wherein said reservoir contains an intercalable compound.

21. An electrochemically tunable, solid-state metamaterial-precursor device comprising a plurality of metamaterial-precursor unit cells, wherein each of said metamaterial-precursor unit cells comprises:
  (a) an ion conductor that is conductive for mobile metal ions;
  (b) a first electrode in contact with said ion conductor, wherein said first electrode is contained at least partially in a negative space disposed on said ion conductor;
  (c) a second electrode in contact with said ion conductor, wherein said second electrode is electrically isolated from said first electrode; and
  (d) a metamaterial-precursor region contained at least partially within a precursor positive space disposed on said ion conductor, wherein said precursor positive space contains a porous material or is open space.

22. The device of claim 21, wherein said precursor positive space is open space.

23. The device of claim 21, wherein said precursor positive space contains no metal.

24. The device of claim 21, wherein said plurality of metamaterial-precursor unit cells is characterized by an average unit cell period from about 10 nanometers to about 1 millimeter.

25. The device of claim 21, wherein each of said first electrode and said second electrode is transparent.

26. The device of claim 21, wherein said first electrode is selected from the group consisting of a conductive metal oxide, a photoconductor, a gated semiconductor, and combinations thereof.

27. The device of claim 21, wherein said precursor positive space is at an outer surface of each of said metamaterial-precursor unit cells.

28. The device of claim 21, wherein said precursor positive space is submerged within each of said metamaterial-precursor unit cells.

29. The device of claim 21, wherein each of said metamaterial-precursor unit cells further comprises a transparent conducting layer disposed on said metamaterial-precursor region.

30. The device of claim 21, wherein said precursor positive space contains a porous, positive-space electrode material.

31. The device of claim 30, wherein said porous, positive-space electrode material has the same composition as said first electrode.

32. The device of claim 21, said device further comprising at least one reservoir in contact with said second electrode, wherein said reservoir is electrochemically configured to controllably supply or receive metal atoms.

33. The device of claim 32, wherein said reservoir contains an intercalable compound.

34. The device of claim 33, wherein said device is hermetically sealed.

* * * * *